(12) United States Patent
Li (10) Patent No.: US 11,606,866 B2
(45) Date of Patent: Mar. 14, 2023

(54) ELECTRONIC DEVICE WITH STORAGE FUNCTION

(71) Applicant: Shannon Systems Ltd., Shanghai (CN)

(72) Inventor: Jiangshan Li, Shanghai (CN)

(73) Assignee: SHANNON SYSTEMS LTD., Shanghai (CN)

( * ) Notice: Subject to any disclaimer, the term of this patent is extended or adjusted under 35 U.S.C. 154(b) by 0 days.

(21) Appl. No.: 17/476,705

(22) Filed: Sep. 16, 2021

(65) Prior Publication Data
US 2022/0377915 A1 Nov. 24, 2022

(30) Foreign Application Priority Data
May 18, 2021 (CN) .......................... 202121067298.X (51) Int. Cl.
*H05K 5/00* (2006.01)
(52) U.S. Cl.
CPC ......... *H05K 5/0013* (2013.01); *H05K 5/0052* (2013.01)
(58) Field of Classification Search
None
See application file for complete search history.

(56) References Cited

U.S. PATENT DOCUMENTS

| | | | | |
|---|---|---|---|---|
| 4,585,122 A * | 4/1986 | Stegenga | ............. | H05K 9/0067 361/801 |
| 8,149,583 B2 * | 4/2012 | Ishii | ...................... | H05K 3/368 361/752 |
| 10,186,471 B2 * | 1/2019 | Chen | ......................... | G06F 1/20 |
| 10,477,706 B1 * | 11/2019 | Wang | ................... | H05K 5/0008 |
| 10,524,370 B2 * | 12/2019 | Sreenivasan | ........... | H02H 9/045 |
| 2008/0030944 A1 * | 2/2008 | Lalouette | ............. | G11B 33/123 |
| 2008/0144270 A1 * | 6/2008 | Dal Porto | ............ | H05K 5/0278 361/679.34 |
| 2014/0160661 A1 * | 6/2014 | Mangay-Ayam, Jr. | ...................... | H05K 1/0203 312/223.1 |
| 2018/0249585 A1 * | 8/2018 | Yoshida | ................... | H05K 5/04 |

* cited by examiner

*Primary Examiner* — James Wu
*Assistant Examiner* — Christopher L Augustin
(74) *Attorney, Agent, or Firm* — McClure, Qualey & Rodack, LLP (57) ABSTRACT

An electronic device with a storage function is provided. The electronic device includes a main connection bolt and a housing. The housing includes a first housing member and a second housing member. The first housing member includes two hooks and a fastening portion. The second housing member includes two wedging portions and a fastening base. The hooks are wedged into the wedging portions to restrict the freedom of the first housing member to move relative to the second housing member in a first direction. The main connection bolt connects the fastening portion to the fastening base in a second direction to restrict the freedom of the first housing member to move relative to the second housing member in the first direction. The first direction is perpendicular to the second direction.

7 Claims, 7 Drawing Sheets

ELECTRONIC DEVICE WITH STORAGE FUNCTION

CROSS REFERENCE TO RELATED APPLICATIONS

This application claims priority of China Patent Application No. 202121067298.X, filed on May 18, 2021, the entirety of which is incorporated by reference herein.

BACKGROUND OF THE INVENTION

Field of the Invention

The present invention relates to an electronic device, and in particular to an electronic device with a storage function.

Description of the Related Art

Conventional electronic devices with a storage function (such as a solid-state disk), commonly have two or more circuit boards. The circuit boards are affixed to the housing of the electronic device by bolts. The housing of the electronic device includes a first housing member and a second housing member. The first housing member is combined to the second housing member by bolts. Conventionally, to sufficiently affix the first housing member, the second housing member and the circuit boards, a large number of bolts are required (usually more than 10 bolts). The conventional electronic device therefore costs more, and the assembly process is more complex.

BRIEF SUMMARY OF THE INVENTION

Embodiments of the invention are provided to address the aforementioned difficulty.

In one embodiment, an electronic device with a storage function is provided. The electronic device includes a main connection bolt and a housing. The housing includes a first housing member and a second housing member. The first housing member includes two hooks and a fastening portion. The second housing member includes two wedging portions and a fastening base. The hooks are wedged into the wedging portions to restrict the freedom of the first housing member to move relative to the second housing member in a first direction. The main connection bolt connects the fastening portion to the fastening base in a second direction to restrict the freedom of the first housing member to move relative to the second housing member in the first direction. The first direction is perpendicular to the second direction.

In one embodiment, the hooks and the wedging portions are formed on a first side of the housing, the fastening portion and the fastening base are formed on a second side of the housing, and the first side is opposite the second side.

In one embodiment, the first housing member further comprises two first supporting posts, each first supporting post extends in the first direction, each hook is formed on one first supporting post, and the wedging portions are formed on the first inner surface of the second housing member.

In one embodiment, the fastening portion protrudes from a first wall of the first housing member, the fastening base protrudes from a second inner surface of the second housing member, a second wall of the second housing member has a wall notch, and when the first housing member is combined with the second housing member, the fastening portion is inserted into the wall notch and overlaps the fastening base.

In one embodiment, the electronic device includes a first circuit board and a second circuit board. The first circuit board is connected to the first housing member. The second circuit board is connected to the second housing member and coupled to the first circuit board. The second circuit board is parallel to the first circuit board, and the second circuit board abuts the free ends of the first supporting posts and is supported by the first supporting posts.

In one embodiment, the first housing member further comprises two second supporting posts, the second supporting posts are formed on the second side of the housing, the second circuit board abuts the free ends of the second supporting posts and is supported by the second supporting posts.

In one embodiment, the first circuit board has a plurality of board notches, and the first supporting posts and the second supporting posts pass through the board notches.

In one embodiment, the electronic device further comprises two first bolts. The first housing member comprises two first fastening stages and two first restriction stages, each first restriction stage comprises a first restriction post, the first circuit board comprises two first fastening holes and two first positioning holes, the first bolts pass through the first fastening holes to affix the first circuit board to the first fastening stages, and the first restriction posts pass through the first positioning holes to restrict the first circuit board.

In one embodiment, the first circuit board comprises a connection port, and the first fastening holes and the connection port are located on the same side of the first circuit board.

In one embodiment, the electronic device further comprises two second bolts. The second housing member comprises two second fastening stages and two second restriction stages, each second restriction stage comprises a second restriction post, the second circuit board comprises two second fastening holes and two second positioning holes, the second bolts pass through the second fastening holes to affix the second circuit board to the second fastening stage, and the second restriction posts pass through the second positioning holes to restrict the second circuit board.

In one embodiment, an electronic device with a storage function is provided. The electronic device includes a first housing member, a first circuit board, two first bolts, a second housing member and a second circuit board. The first housing member includes two first fastening stages and two first restriction stages, wherein each first restriction stage comprises a first restriction post. The first circuit board is connected to the first housing member, wherein the first circuit board comprises two first fastening holes and two first positioning holes. The first bolts pass through the first fastening holes to affix the first circuit board to the first fastening stages, and the first restriction posts pass through the first positioning holes to restrict the first circuit board. The second circuit board is connected to the second housing member and coupled to the first circuit board, wherein the second circuit board is parallel to the first circuit board.

In one embodiment, the first housing member further comprises a plurality of supporting posts, the four corners of the second circuit board abut the free ends of the supporting posts, and the second circuit board is supported by the supporting posts.

In the embodiment of the invention, utilizing the hooks and the wedging portions, the first housing member can be affixed to the second housing member by only one main connection bolt. The assembly process is simpler than that of the conventional art, as there are fewer bolts. Additionally, the circuit boards are positioned by the supporting posts and the restriction posts, and the circuit boards are connected to the housings using fewer bolts. The electronic device with a storage function of the embodiment of the invention costs less and is easier to assemble, and the first housing member, the second housing member, and the circuit boards are sufficiently affixed.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
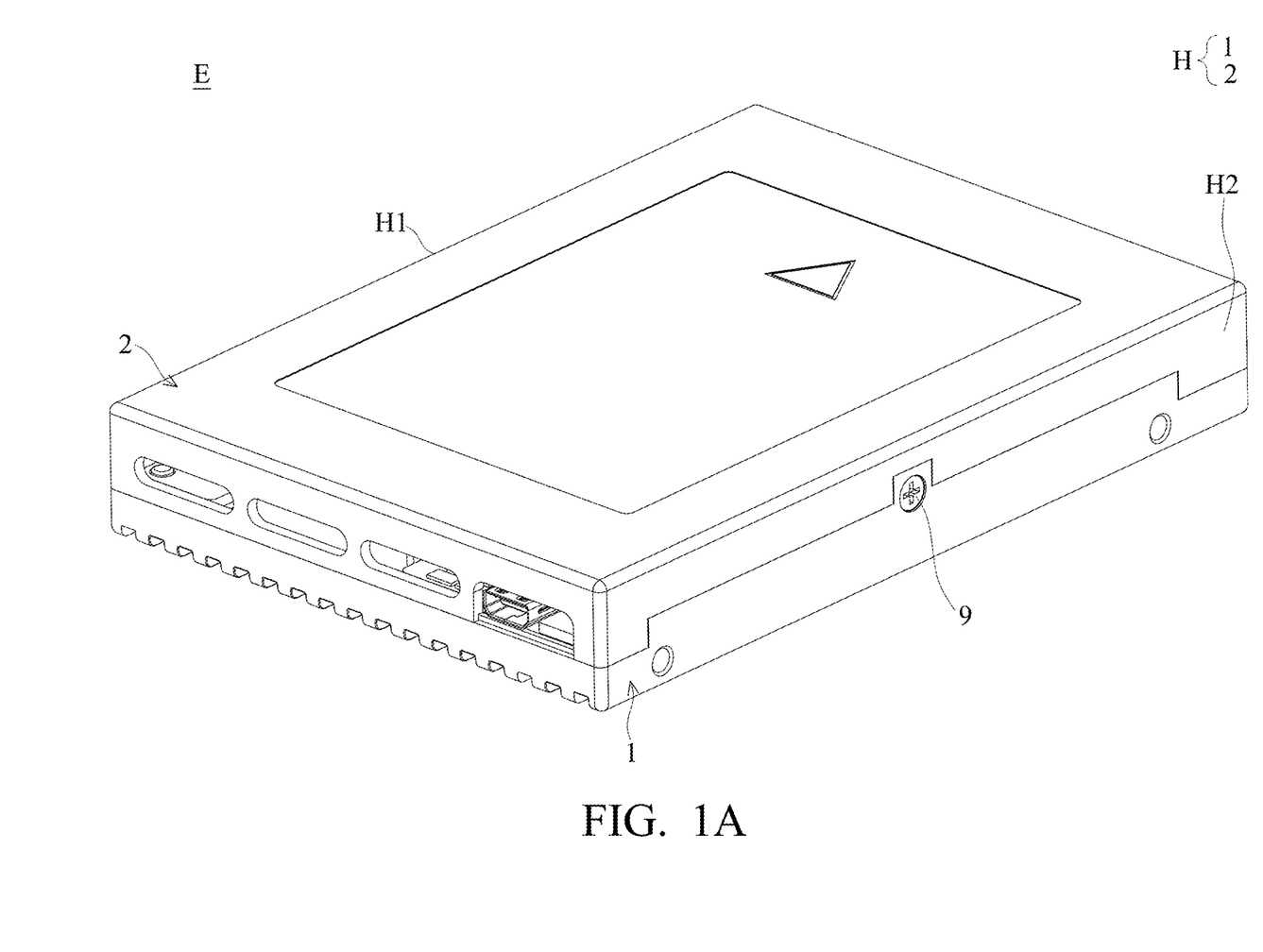
FIG. 1A is a perspective view of an electronic device of an embodiment of the invention.
Figure 1B:
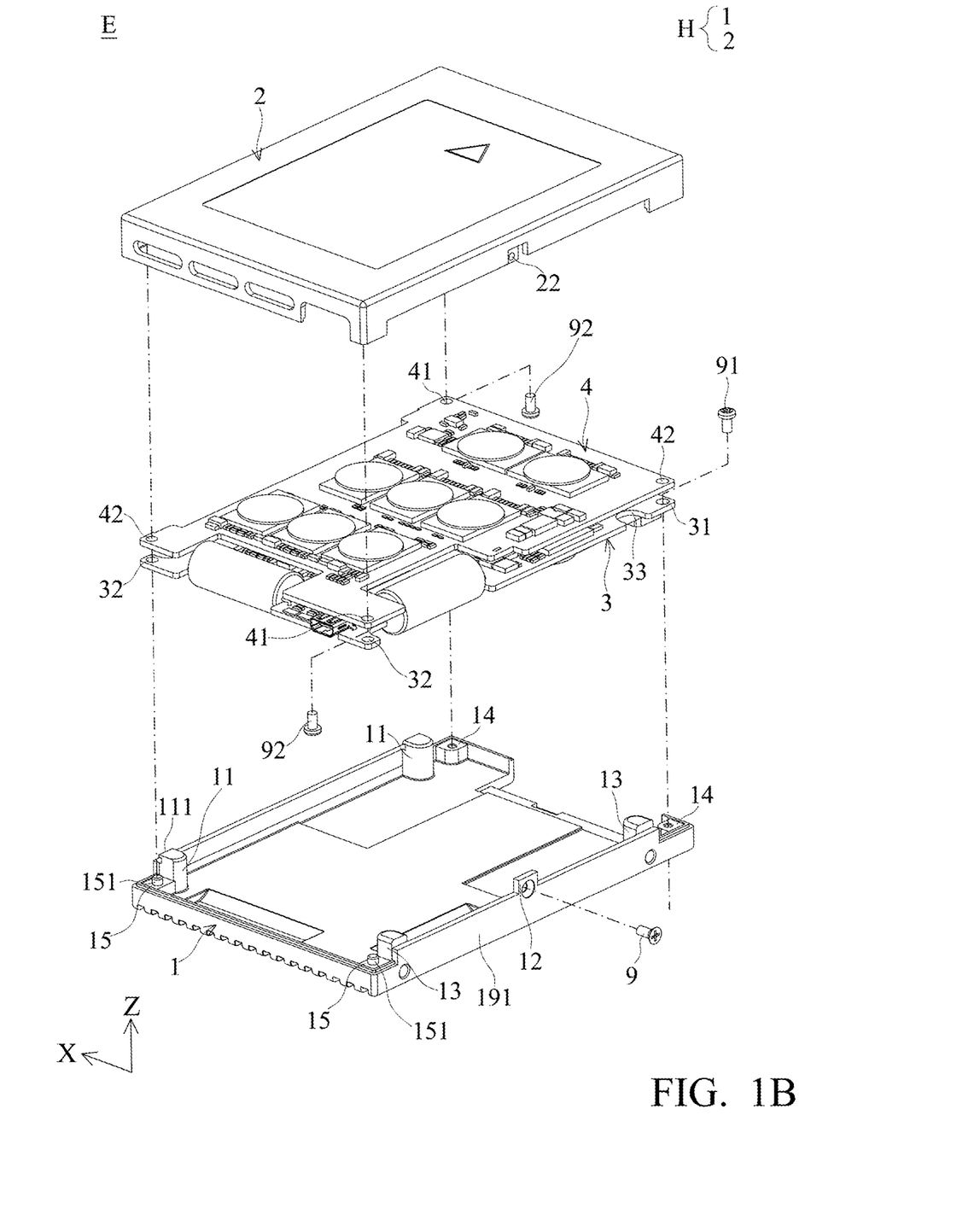
FIG. 1B is an exploded view of the electronic device of the embodiment of the invention.
Figure 2A:
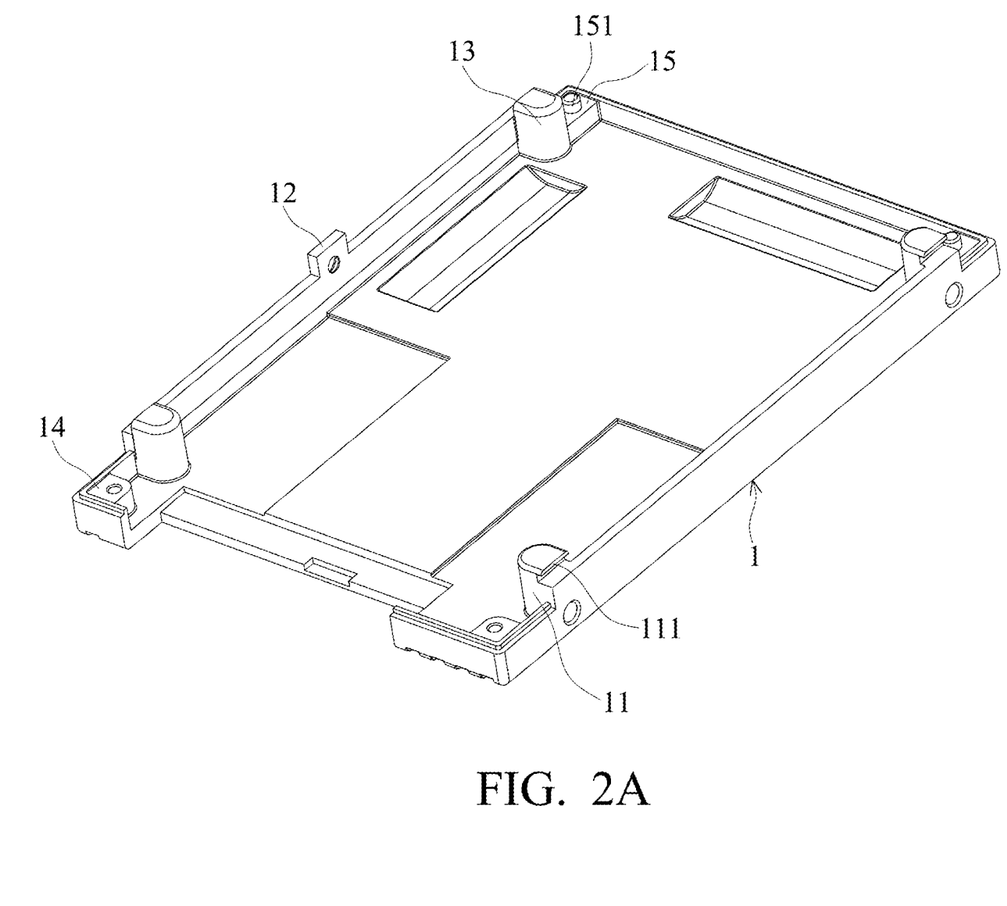
FIG. 2A shows the details of a first housing member of the embodiment of the invention.
Figure 2B:
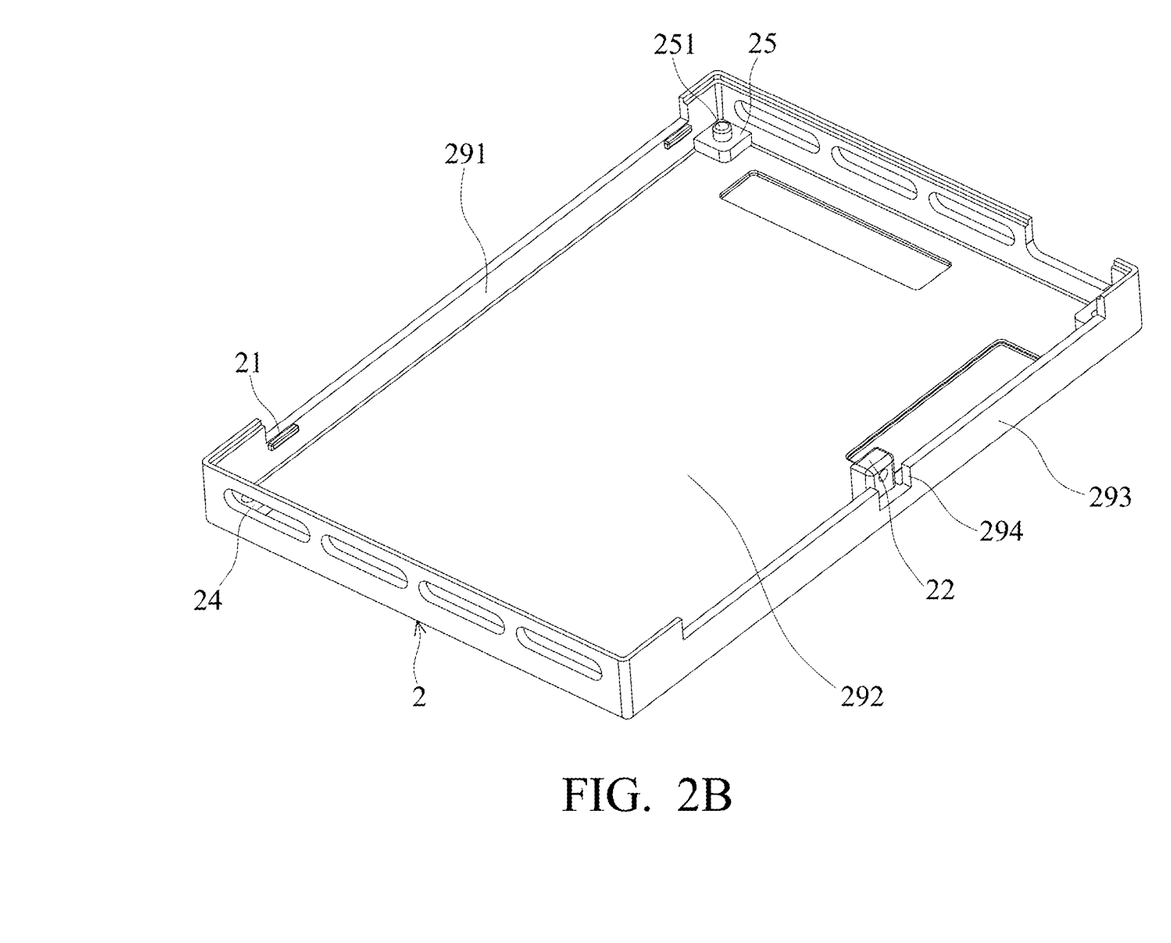
FIG. 2B shows the details of a second housing member of the embodiment of the invention.
Figure 2C:
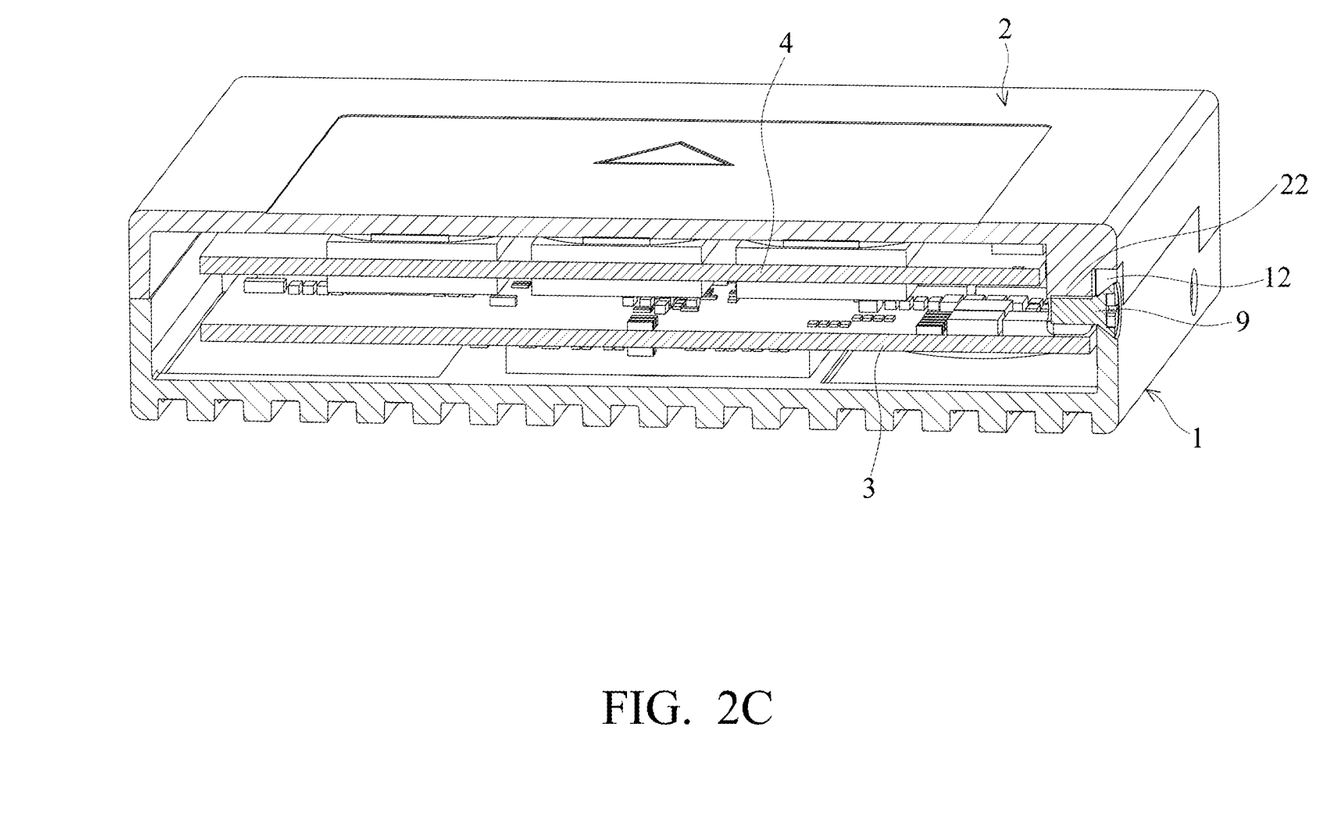
FIG. 2C is a cross sectional view of the electronic device of the embodiment of the invention.

FIG. 1A is a perspective view of an electronic device of an embodiment of the invention. FIG. 1B is an exploded view of the electronic device of the embodiment of the invention. FIG. 2A shows the details of a first housing member of the embodiment of the invention. FIG. 2B shows the details of a second housing member of the embodiment of the invention. FIG. 2C is a cross sectional view of the electronic device of the embodiment of the invention. With reference to FIGS. 1A, 1B, 2A, 2B and 2C, the electronic device E with storage function of the embodiment of the invention includes a main connection bolt 9 and a housing H. The housing H includes a first housing member 1 and a second housing member 2. The first housing member 1 includes two hooks 111 and a fastening portion 12. The second housing member 2 includes two wedging portions 21 and a fastening base 22. The hooks 111 are wedged into the wedging portions 21 to restrict the freedom of the first housing member 1 to move relative to the second housing member 2 in the first direction Z. The main connection bolt 9 connects the fastening portion 12 to the fastening base 22 in a second direction X to restrict the freedom of the first housing member 1 relative to the second housing member 2 in the first direction Z. The first direction Z is perpendicular to the second direction X.

With reference to FIGS. 1A, 1B, 2A and 2B, in one embodiment, the hooks 111 and the wedging portions 21 are formed on a first side H1 of the housing H. The fastening portion 12 and the fastening base 22 are formed on a second side H2 of the housing H. The first side H1 is opposite the second side H2. In one embodiment, the wedging portions 21 are protrusions.

With reference to FIGS. 1A, 1B, 2A and 2B, in one embodiment, the first housing member 1 further comprises two first supporting posts 11. Each first supporting post 11 extends in the first direction Z. Each hook 111 is formed on each first supporting post 11. The wedging portions 21 are formed on a first inner surface 291 of the second housing member 2.

With reference to FIGS. 1A, 1B, 2A and 2B, in one embodiment, the fastening portion 12 protrudes from a first wall 191 of the first housing member 1. The fastening base 22 protrudes from a second inner surface 292 of the second housing member 2. A second wall 293 of the second housing member 2 has a wall notch 294. When the first housing member 1 is combined with the second housing member 2, the fastening portion 12 is inserted into the wall notch 294 and overlaps the fastening base 22.

Figure 3:
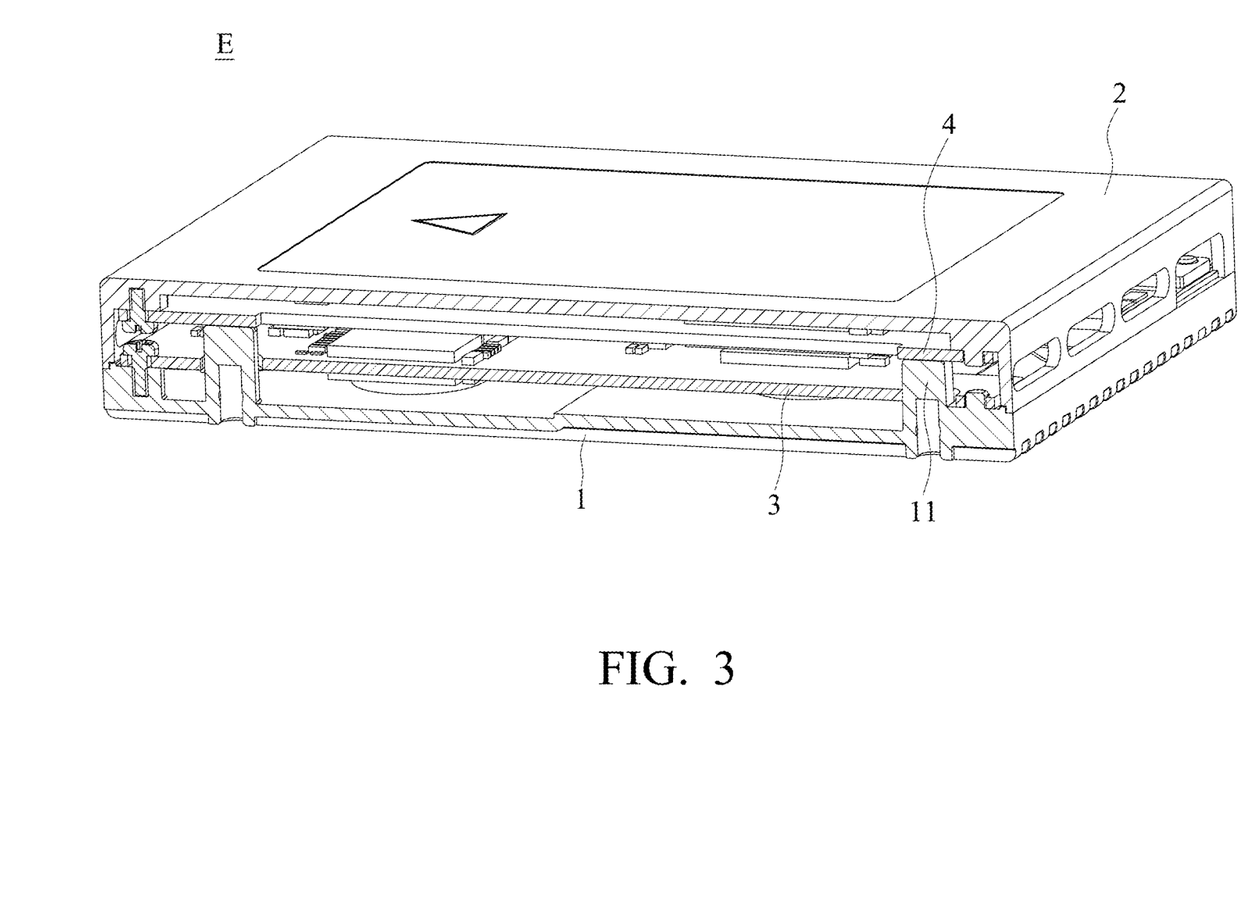
FIG. 3 is a cross sectional view of another portion of the electronic device of the embodiment of the invention.

FIG. 3 is a cross sectional view of another portion of the electronic device of the embodiment of the invention. With reference to FIGS. 1B and 3, in one embodiment, the electronic device E includes a first circuit board 3 and a second circuit board 4. The first circuit board 3 is connected to the first housing member 1. The second circuit board 4 is connected to the second housing member 2 and coupled to the first circuit board 3. The second circuit board 4 is parallel to the first circuit board 3. The second circuit board 4 abuts the free ends of the first supporting posts 11 and is supported by the first supporting posts 11.

With reference to FIGS. 1A, 1B and 2B, in one embodiment, the first housing member 1 further comprises two second supporting posts 13. The second supporting posts 13 are formed on the second side H2 of the housing H. The second circuit board 4 abuts the free ends of the second supporting posts 13 and is supported by the second supporting posts 13.

Figure 4:
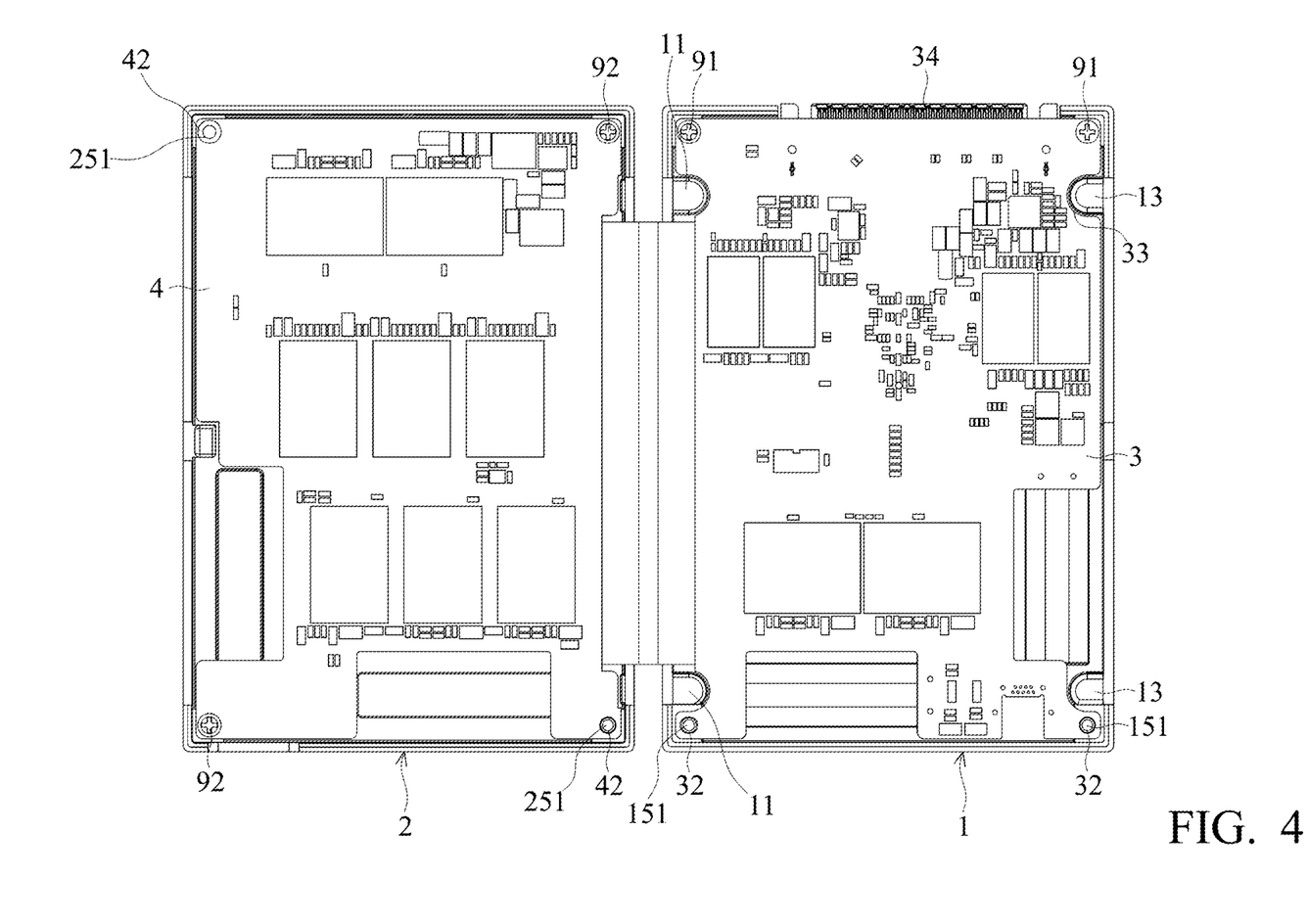
FIG. 4 shows the circuit boards combined to the housing of the embodiment of the invention.

FIG. 4 shows the circuit boards combined to the housing of the embodiment of the invention. With reference to FIGS. 1B and 4, in one embodiment, the first circuit board 3 has a plurality of board notches 33, and the first supporting posts 11 and the second supporting posts 13 pass through the board notches 33.

With reference to FIGS. 1B and 4, in one embodiment, the electronic device E further comprises two first bolts 91. The first housing member 1 comprises two first fastening stages 14 and two first restriction stages 15. Each first restriction stage 15 comprises a first restriction post 151. The first circuit board 3 comprises two first fastening holes 31 and two first positioning holes 32. The first bolts 91 pass through the first fastening holes 31 to affix the first circuit board 3 to the first fastening stage 14. The first restriction posts 151 pass through the first positioning holes 32 to restrict the first circuit board 3.

With reference to FIGS. 1B and 4, in one embodiment, the first circuit board 3 comprises a connection port 34, and the first fastening holes 31 and the connection port 34 are located on the same side of the first circuit board 3.

With reference to FIGS. 1B, 2B and 4, in one embodiment, the electronic device E further comprises two second bolts 92. The second housing member 2 comprises two second fastening stages 24 and two second restriction stages 25. Each second restriction stage 25 comprises a second restriction post 251. The second circuit board 4 comprises two second fastening holes 41 and two second positioning holes 42. The second bolts 92 pass through the second fastening holes 41 to affix the second circuit board 4 to the second fastening stage 24. The second restriction posts 251 pass through the second positioning holes 42 to restrict the second circuit board 4.

In one embodiment, the fastening holes and the positioning holes mentioned above can be circular holes or oval holes to facilitate the assembly process.

With reference to FIGS. 1B, in one embodiment, the four corners of the second circuit board 4 abut the free ends of the supporting posts (the first supporting posts 11 and the second supporting posts 13) of the first housing member 1, and the second circuit board is supported by the supporting posts (the first supporting posts 11 and the second supporting posts 13).

In the embodiment of the invention, utilizing the hooks and the wedging portions, the first housing member can be affixed to the second housing member by only one main connection bolt. There are fewer bolts than in the conventional art, which greatly simplifies the assembly process. Additionally, the circuit boards are positioned by the supporting posts and the restriction posts, and the circuit boards are connected to the housings using fewer bolts. The electronic device with a storage function of the embodiment of the invention has a lower cost and can be easily assembled, and the first housing member, the second housing member and the circuit boards are sufficiently affixed.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device with a storage function, comprising:
    a main connection bolt;
    a housing, comprising:
    a first housing member, comprising two hooks and a fastening portion;
    a second housing member, comprising two wedging portions and a fastening base, wherein the hooks are wedged into the wedging portions to restrict freedom of the first housing member to move relative to the second housing member in a first direction, the main connection bolt connects the fastening portion to the fastening base in a second direction to restrict the freedom of the first housing member to move relative to the second housing member in the first direction, and the first direction is perpendicular to the second direction, wherein the hooks and the wedging portions are formed on a first side of the housing, the fastening portion and the fastening base are formed on a second side of the housing, and the first side is opposite the second side, wherein the first housing member further comprises two first supporting posts, each first supporting post extends in the first direction, each hook is formed on one first supporting post, and the wedging portions are formed on a first inner surface of the second housing member, wherein the fastening portion protrudes from a first wall of the first housing member, the fastening base protrudes from a second inner surface of the second housing member, a second wall of the second housing member has a wall notch, and when the first housing member is combined with the second housing member, the fastening portion is inserted into the wall notch and overlaps the fastening base;
    a first circuit board, connected to the first housing member; and
    a second circuit board, connected to the second housing member and coupled to the first circuit board, wherein the second circuit board is parallel to the first circuit board, and the second circuit board abuts free ends of the first supporting posts and is supported by the first supporting posts,
    wherein the first housing member further comprises two second supporting posts, the second supporting posts are formed on the second side of the housing, the second circuit board abuts free ends of the second supporting posts and is supported by the second supporting posts.

2. The electronic device as claimed in claim 1, wherein the first circuit board has a plurality of board notches, and the first supporting posts and the second supporting posts pass through the board notches.

3. The electronic device as claimed in claim 2, further comprising two first bolts, wherein the first housing member comprises two first fastening stages and two first restriction stages, each first restriction stage comprises a first restriction post, the first circuit board comprises two first fastening holes and two first positioning holes, the first bolts pass through the first fastening holes to affix the first circuit board to the first fastening stages, and the first restriction posts pass through the first positioning holes to restrict the first circuit board.

4. The electronic device as claimed in claim 3, wherein the first circuit board comprises a connection port, and the first fastening holes and the connection port are located on the same side of the first circuit board.

5. The electronic device as claimed in claim 4, further comprising two second bolts, wherein the second housing member comprises two second fastening stages and two second restriction stages, each second restriction stage comprises a second restriction post, the second circuit board comprises two second fastening holes and two second positioning holes, the second bolts pass through the second fastening holes to affix the second circuit board to the second fastening stages, and the second restriction posts pass through the second positioning holes to restrict the second circuit board.

6. An electronic device with a storage function, comprising:
    a first housing member, comprising two first fastening stages and two first restriction stages, wherein each first restriction stage comprises a first restriction post;
    a first circuit board, connected to the first housing member, wherein the first circuit board comprises two first fastening holes and two first positioning holes;
    two first bolts, wherein the first bolts pass through the first fastening holes to affix the first circuit board to the first fastening stages, and the first restriction posts pass through the first positioning holes to restrict the first circuit board;

a second housing member;

a second circuit board, connected to the second housing member and coupled to the first circuit board, wherein the second circuit board is parallel to the first circuit board, wherein the first circuit board comprises a connection port, and the first fastening holes and the connection port are located on the same side of the first circuit board; and two second bolts, wherein the second housing member comprises two second fastening stages and two second restriction stages, each second restriction stage comprises a second restriction post, the second circuit board comprises two second fastening holes and two second positioning holes, the second bolts pass through the second fastening holes to affix the second circuit board to the second fastening stage, and the second restriction posts pass through the second positioning holes to restrict the second circuit board.

7. The electronic device as claimed in claim 6, wherein the first housing member further comprises a plurality of supporting posts, the four corners of the second circuit board abut free ends of the supporting posts, and the second circuit board is supported by the supporting posts.

\* \* \* \* \*